(12) United States Patent
Pompei et al.

(10) Patent No.: US 6,661,285 B1
(45) Date of Patent: Dec. 9, 2003

(54) POWER EFFICIENT CAPACITIVE LOAD DRIVING DEVICE

(75) Inventors: F. Joseph Pompei, Wayland, MA (US); John Carl Olsson, Somerville, MA (US)

(73) Assignee: Holosonic Research Labs, Watertown, MA (US)

( * ) Notice: Subject to any disclaimer, the term of this patent is extended or adjusted under 35 U.S.C. 154(b) by 45 days.

(21) Appl. No.: 09/968,267

(22) Filed: Oct. 1, 2001

Related U.S. Application Data

(60) Provisional application No. 60/237,247, filed on Oct. 2, 2000.

(51) Int. Cl.[7] ................................................. H03F 3/217
(52) U.S. Cl. .................................. 330/251; 310/316.03
(58) Field of Search ................................. 330/251, 281, 330/261; 310/316.03; 320/166

(56) References Cited

U.S. PATENT DOCUMENTS

| | | | |
|---|---|---|---|
| 4,016,501 A | 4/1977 | Jasinski et al. ................ 330/10 |
| 4,324,950 A | 4/1982 | Strickland .................... 178/1 A |
| 4,600,891 A | 7/1986 | Taylor, Jr. et al. ............ 330/10 |
| 5,245,242 A | 9/1993 | Hall ........................... 310/316 |
| 5,329,245 A | 7/1994 | Hammond et al. ......... 330/254 |
| 5,396,194 A | 3/1995 | Williamson et al. ........ 330/297 |
| 5,471,171 A | 11/1995 | Itakura et al. .............. 330/253 |
| 5,506,532 A | 4/1996 | Milazzo ..................... 327/175 |
| 5,691,592 A | 11/1997 | Gunderson et al. ......... 310/317 |
| 5,821,701 A | 10/1998 | Teggatz et al. ............. 315/307 |
| 5,963,086 A | 10/1999 | Hall ............................. 330/10 |
| 6,011,345 A | 1/2000 | Murray et al. ............... 310/324 |
| 6,016,040 A * | 1/2000 | Hoffmann et al. .......... 318/116 |
| 6,034,489 A * | 3/2000 | Weng ......................... 315/307 |
| 6,064,259 A | 5/2000 | Takita ......................... 330/10 |
| 6,081,075 A | 6/2000 | Littlefield ............... 315/209 R |
| 6,121,715 A * | 9/2000 | Hoffmann et al. ..... 310/316.03 |
| 6,130,831 A | 10/2000 | Matsunaga .................. 363/98 |
| 6,133,714 A * | 10/2000 | Hoffmann et al. .......... 320/166 |
| 6,191,957 B1 * | 2/2001 | Peterson ...................... 363/17 |
| 6,204,729 B1 | 3/2001 | Takita ......................... 330/146 |
| 6,232,754 B1 * | 5/2001 | Liebler et al. .............. 323/272 |

* cited by examiner

Primary Examiner—Brian Young
Assistant Examiner—John Nguyen
(74) Attorney, Agent, or Firm—Weingarten, Schurgin, Gagnebin & Lebovici LLP

(57) ABSTRACT

A device and method for driving a capacitive load that has a more power efficient design. The power efficient capacitive load driving device can be used to drive one or more acoustic transducers of a parametric audio system with low distortion and a flat frequency response. The capacitive load driving device includes a current source, a plurality of switches interconnected in an "H-bridge" configuration coupled to an output of the current source, and a controller. The plurality of interconnected switches is coupleable to at least one capacitive load. By driving the capacitive load with at least one controlled switched drive signal, the capacitive load driving device delivers (recovers) energy to (from) the capacitive load in an optimal manner, thereby generating a desired output voltage waveform across the capacitive load with increased power efficiency.

21 Claims, 4 Drawing Sheets

POWER EFFICIENT CAPACITIVE LOAD DRIVING DEVICE

CROSS REFERENCE TO RELATED APPLICATIONS

This application claims priority of U.S. Provisional Patent Application No. 60/237,247 filed Oct. 2, 2000 entitled PARAMETRIC ARRAY AMPLIFIER METHODS.

STATEMENT REGARDING FEDERALLY SPONSORED RESEARCH OR DEVELOPMENT

N/A

BACKGROUND OF THE INVENTION

The present invention relates generally to devices and methods for driving capacitive loads, and more specifically to a power efficient capacitive load driving device that can be used to drive one or more acoustic transducers of a parametric audio system.

Parametric audio systems are known that employ one or more acoustic transducers to project an ultrasonic carrier signal modulated with an audio signal through the air for subsequent regeneration of the audio signal. U.S. patent application Ser. No. 09/758,606 filed Jan. 11, 2001 entitled PARAMETRIC AUDIO SYSTEM discloses a parametric audio system that includes a modulator configured to modulate an ultrasonic carrier signal with an audio signal, a driver amplifier configured to amplify the modulated ultrasonic signal, and one or more acoustic transducers configured to receive the amplified ultrasonic signal and project it through the air along a selected path. Because of the non-linear propagation characteristics of the air, the modulated ultrasonic carrier signal is demodulated as it passes through the air, thereby regenerating the audio signal along the selected path of projection.

Each acoustic transducer included in the above-referenced parametric audio system is a wide-bandwidth capacitive transducer such as a membrane-type electrostatic transducer. Further, the driver amplifier of the parametric audio system includes one or more inductors that can be coupled to the capacitive load of the acoustic transducer, thereby effectively forming a resonant circuit to facilitate the transfer of energy between the driver amplifier and the acoustic transducer.

One drawback of the above-referenced parametric audio system is that the transfer of energy between the driver amplifier and the acoustic transducer can be inefficient and can cause high system power requirements. For example, because the load provided by the acoustic transducer is reactive, a significant amount of the energy delivered to the acoustic transducer by the driver amplifier is reflected back to the driver amplifier, which typically recovers at least a portion of the reflected energy via the above-mentioned inductor and dissipates the remaining energy as heat. Such energy dissipation can increase both the power and cooling requirements of the system.

Another drawback of the above-referenced parametric audio system is that, in some configurations, the driver amplifier may deliver energy to the acoustic transducer with some distortion and/or reduced bandwidth. To address this problem, the inductor of the driver amplifier can be connected to the capacitive load of the acoustic transducer via a damping resistor to dampen the resonance between the inductor and the capacitive load. However, as energy is transferred between the driver amplifier and the acoustic transducer through the damping resistor, at least some of this energy is typically absorbed by the damping resistor, which dissipates the absorbed energy as heat to further degrade the power efficiency of the system.

It would therefore be desirable to have a more power efficient capacitive load driving device. Such a device would be configurable to drive one or more acoustic transducers of a parametric audio system. It would also be desirable to have a capacitive load driving device that can be used to drive an acoustic transducer of a parametric audio system with low distortion and to assure wideband output capability.

BRIEF SUMMARY OF THE INVENTION

In accordance with the present invention, a device and method for driving a capacitive load is provided that has a more power efficient design. The power efficient capacitive load driving device can be used to drive one or more acoustic transducers of a parametric audio system with low distortion and increased bandwidth. Such benefits are achieved by coupling the capacitive load driving device to a capacitive load, and driving the capacitive load with at least one controlled switched drive signal.

In one embodiment, the capacitive load driving device includes a current source, a plurality of switches interconnected in an "H-bridge" configuration coupled to an output of the current source, and a controller. The current source comprises a DC current source including a voltage source having a negative terminal connected to ground potential and a positive terminal, an optional charge capacitor coupled between the positive terminal of the voltage source and the ground potential, and a relatively large-valued inductor having first and second terminals. The relatively large inductor value is selected to achieve a desired low resonant frequency value with the capacitive load. The DC current source further includes a first switch connected between the positive terminal of the voltage source and the first terminal of the inductor and configured to allow current to flow from the voltage source through the first switch to the inductor, and a diode connected between the first terminal of the inductor and the ground potential and configured to allow current to flow from the ground potential through the diode to the inductor. The second terminal of the inductor comprises the DC current source output, which provides the drive energy to the capacitive load.

The plurality of switches interconnected in the "H-bridge" configuration includes a first pair of series-connected switches and a second pair of series-connected switches. Each of the first and second pairs of series-connected switches is connected between the output of the DC current source and the ground potential. Further, the capacitive load is coupled between the node connection of the first pair of series-connected switches and the corresponding node connection of the second pair of series-connected switches. The first switch, which is connected between the voltage source and the inductor, and the plurality of switches interconnected in the H-bridge configuration, include respective control terminals.

The controller is configured to (1) receive a first input signal representative of a predetermined input waveform, a second input signal representative of a measured voltage level across the capacitive load, and a third input signal representative of a measured current level through the inductor, and (2) control the operation of the DC current source and the plurality of interconnected switches to generate an output voltage waveform across the capacitive load that corresponds to the predetermined input waveform. In a preferred embodiment, the controller employs a mathematically optimal control algorithm to control the operation of the DC current source and the plurality of interconnected switches. Such control is carried out by generating suitable control signals and applying the control signals to the respective control terminals of the switches.

The following control activities are presented for purposes of illustration. The controller may perform these control activities at fixed or variable time intervals. In the event it is determined that (1) the level of the predetermined input waveform is increasing and (2) the capacitive load voltage level is less than the level of the predetermined input voltage, the controller controls the DC current source and the plurality of interconnected switches to provide a first controlled switched drive signal to the capacitive load that causes the capacitive load to charge positively. In the event it is determined that (1) the level of the predetermined input waveform is increasing and (2) the capacitive load voltage level is greater than or equal to the level of the predetermined input voltage, the controller controls the DC current source and the plurality of interconnected switches to hold the charge on the capacitive load.

In the event it is determined that (1) the level of the predetermined input waveform is decreasing and (2) the capacitive load voltage level is greater than the level of the predetermined input voltage, the controller controls the DC current source and the plurality of interconnected switches to provide a second controlled switched drive signal to the capacitive load that causes the capacitive load to discharge or charge negatively. In the event it is determined that (1) the level of the predetermined input waveform is decreasing and (2) the capacitive load voltage level is less than or equal to the level of the predetermined input voltage, the controller controls the DC current source and the plurality of interconnected switches to hold the charge on the capacitive load. In this way, the controller controls the operation of the DC current source and the plurality of interconnected switches to generate the output voltage waveform across the capacitive load corresponding to the predetermined input waveform.

By driving a capacitive load with at least one controlled switched drive signal, the presently disclosed capacitive load driving device delivers (recovers) energy to (from) the capacitive load in a more efficient manner, thereby generating a desired output voltage waveform across the capacitive load with increased power efficiency. Further, because the presently disclosed device includes reactive elements (e.g., the current source inductor) that store energy rather than merely dissipate energy as heat, system power and cooling requirements are reduced.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

U.S. Provisional Patent Application No. 60/237,247 filed Oct. 2, 2000 is incorporated herein by reference.

A device and method for driving a capacitive load is provided that has a more power efficient design. Improved power efficiency is achieved by configuring the capacitive load driving device to drive a capacitive load with at least one controlled switched drive signal, which allows more efficient delivery (recovery) of energy to (from) the load. Further, because the capacitive load driving device employs reactive elements that store rather than merely dissipate energy, power requirements are reduced. The presently disclosed device can be used to drive the capacitive load of, e.g., one or more acoustic transducers of a parametric audio system with minimal distortion and essentially flat frequency response.

Figure 1:
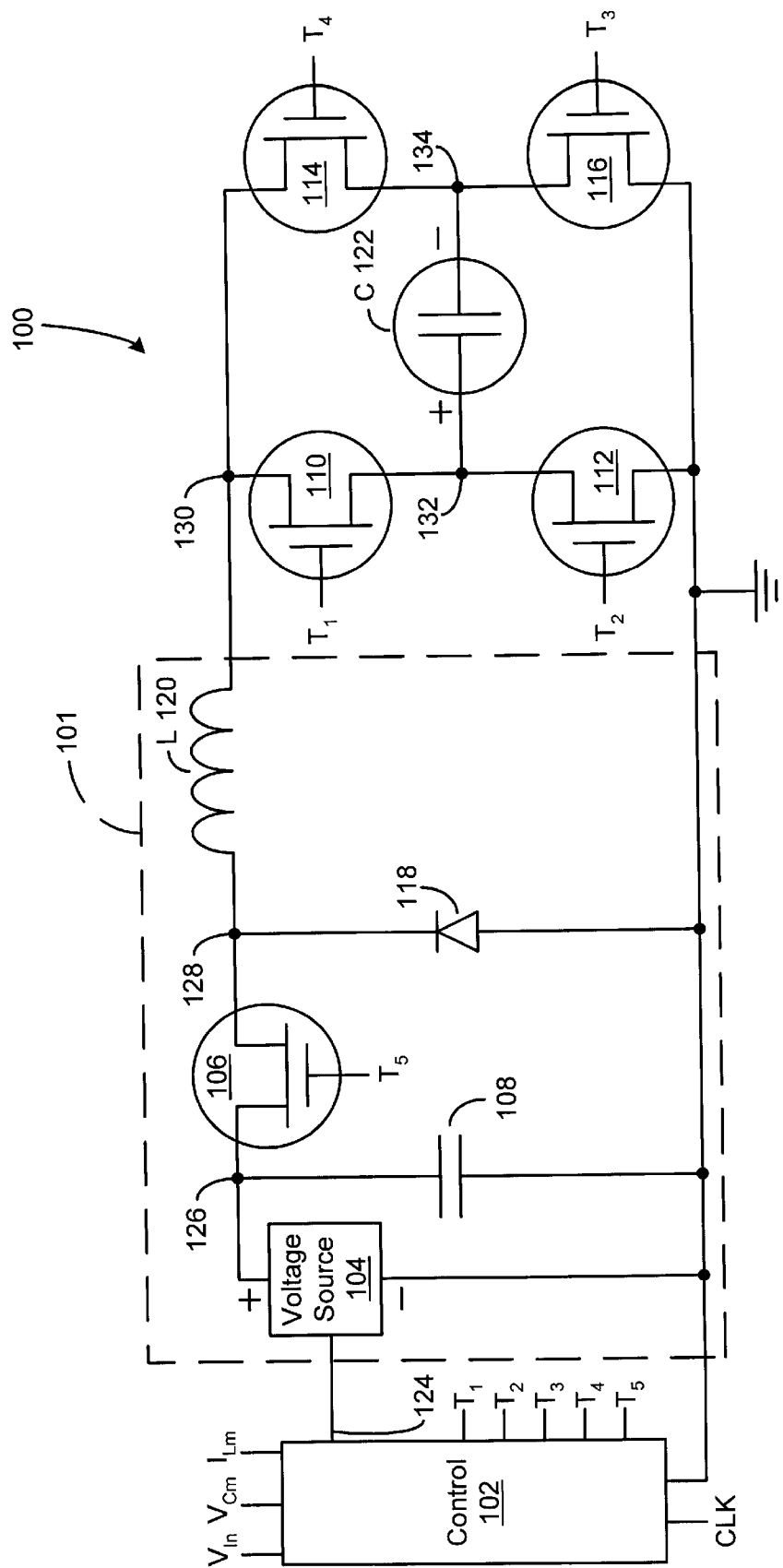
FIG. 1 is a schematic diagram depicting a capacitive load driving device according to the present invention.

FIG. 1 depicts an illustrative embodiment of a capacitive load driving device 100, in accordance with the present invention. In the illustrated embodiment, the capacitive load driving device 100 includes a current source 101 that can be coupled to a capacitive load 122 via a plurality of interconnected switches 110, 112, 114, and 116. The device 100 further includes a controller 102 configured to control the operation of the current source 101 and the plurality of interconnected switches 110, 112, 114, and 116 to provide at least one controlled switched drive signal to the capacitive load 122.

Specifically, the current source 101 comprises a DC current source including a voltage source 104, an optional charge capacitor 108, a switch 106, a diode 118, and a relatively large-valued inductor 120. The voltage source 104 has a positive terminal and a negative terminal, which is coupled to ground potential. One side of the switch 106 is connected to the positive terminal of the voltage source 104 at a node 126, and the other side of the switch is connected to a first terminal of the inductor 120 at a node 128. The switch 106 is configured to allow current to flow in one direction from the node 126 to the node 128. The charge capacitor 108 is coupled between the node 126 and the ground potential. Further, the diode 118 is coupled between the node 128 and the ground potential to allow current to flow in one direction from the ground potential to the node 128. A second terminal of the inductor 120, which constitutes the output of the DC current source, is coupled to the plurality of interconnected switches 110, 112, 114, and 116 at a node 130.

It is noted that the current source 101 may alternatively comprise an AC or time-varying current source with appropriate changes to the control algorithm. Further, the value of the inductor 120 included in the current source 101 may be increased to enhance the stability and consistency of the output current. Moreover, the inductor 120 may comprise a relatively large transformer winding instead of a large-valued inductor.

The plurality of switches 110, 112, 114, and 116 are interconnected in an "H-bridge" configuration. The switches 110 and 112 are connected in series and coupled between the current source output 130 and the ground potential.

Similarly, the switches 114 and 116 are connected in series and coupled between the current source output 130 and the ground potential. The capacitive load 122 is coupled between the node connection 132 of the switches 110 and 112 and the corresponding node connection 134 of the switches 114 and 116. The switches 110 and 116 are configured to allow current to flow from the current source output 130 through the capacitive load 122 to the ground potential as the load 122 charges positively. Further, the switches 112 and 114 are configured to allow current to flow from the ground potential through the capacitive load 122 to the current source output 130 as the load 122 discharges or charges negatively.

The controller 102 is configured to receive an input voltage $V_{in}$ representing a predetermined input voltage waveform, a measured voltage level $V_{Cm}$ representing the voltage level across the capacitive load, a measured current level $I_{Lm}$ representing the current level through the inductor 120, and an optional clock signal CLK having a predetermined clock frequency. The controller 102 is configured to control the operation of the DC current source 101 and the plurality of interconnected switches 110, 112, 114, and 116 to generate an output voltage waveform across the capacitive load 122 that corresponds to the predetermined input voltage waveform. It should be understood that the predetermined input waveform may take the form of any signal representative of the output voltage waveform to be generated, e.g., voltage, current, or digitally-coded instructions.

Specifically, the controller 102 controls the operation of the switches 110, 112, 116, 114, and 106 by generating digital control signals $T_1$, $T_2$, $T_3$, $T_4$, and $T_5$ based on at least the input voltage waveform $V_{in}$, and the measured voltage level $V_{Cm}$, and applying the control signals $T_1 T_2$, $T_3$, $T_4$, and $T_5$ to control terminals of the switches 110, 112, 116, 114, and 106, respectively. The controller 102 may also be configured to regulate the voltage source 104 via at least one line 124 For example, each of the switches 106, 110, 112, 114, and 116 may comprise a power transistor switch such as a power MOSFET switch or any other suitable device. Further, the controller 102 may comprise a suitable microprocessor or Digital Signal Processor (DSP), at least one analog-to-digital converter for converting the input voltage $V_{in}$, the measured voltage level $V_{Cm}$, and the measured current level $I_{Lm}$ to digital form for use by the microprocessor or DSP, and at least one digital-to-analog converter for converting digital signals generated by the microprocessor or DSP to analog form for use in regulating the voltage source 104.

In the illustrated embodiment, the capacitive load 122 comprises one or more acoustic transducers of a parametric audio system (not shown) such as that described in U.S. patent application Ser. No. 09/758,606 filed Jan. 11, 2001, which is incorporated herein by reference. For example, the capacitive load 122 may comprise a wide-bandwidth capacitive transducer, e.g., a membrane-type electrostatic transducer, or a piezoelectric or other suitable transducer. Further, the input voltage $V_{in}$ may be representative of an ultrasonic carrier signal modulated with an audio signal.

Accordingly, the controller 102 may be configured to control the DC current source 101 and the plurality of interconnected switches 110, 112, 114, and 116 to generate an output voltage waveform across the capacitive load of one or more acoustic transducers that corresponds to the modulated ultrasonic carrier signal. The acoustic transducer may then project the modulated ultrasonic carrier signal through the air to demodulate the carrier signal and subsequently regenerate the audio signal. It should be understood, however, that the capacitive load driving device 100 may be configured to provide controlled switched drive signals suitable for driving electrostatic loudspeakers, piezoelectric transducers (e.g., for audio, sonar, or general actuation applications) or any other capacitive load.

Specifically, the capacitive load driving device 100 generates a desired output voltage waveform across the capacitive load 122 by employing the DC current source 101 and the plurality of interconnected switches 110, 112, 114, and 116 to deliver energy to the capacitive load 122, recover energy from the capacitive load 122, or hold energy in the capacitive load 122. For example, the capacitive load driving device 100 may deliver energy to a positively charged capacitive load 122 by charging the inductor 120 to a predetermined current level, and actuating the switches 110 and 116 (i.e., the switches are "closed") while deactivating the switches 112 and 114 (i.e., the switches are "open"). As a result, the capacitive load 122 is oriented such that a positive terminal of the load 122 is effectively connected to the current source output 130 and a negative terminal of the load 122 is effectively connected to the ground potential. The capacitive load driving device 100 then delivers energy to the capacitive load 122 by allowing the inductor current $I_L$ to charge the load 122 to a positive potential.

Further, the capacitive load driving device 100 may recover energy from the capacitive load 122 by actuating the switches 112 and 114 while deactivating the switches 110 and 116. As a result, the capacitive load 122 is oriented such that the positive terminal of the load 122 is effectively coupled to the ground potential and the negative terminal of the load 122 is effectively connected to the current source output 130. The capacitive load driving device 100 then recovers energy from the positively charged capacitive load 122 by allowing the inductor 120 to receive current provided by discharging the load 122. The device 100 may alternatively charge the load 122 to a negative potential.

Moreover, the capacitive load driving device 100 may hold energy in the capacitive load 122 by either actuating the switches 110 and 112 while deactivating the switches 114 and 116, or actuating the switches 114 and In 116 while deactivating the switches 110 and 112. In this way, the capacitive load driving device 100 holds energy in the capacitive load 122 by orienting the load 122 such that either the positive terminal or the negative terminal of the load 122 effectively floats. Because the capacitive load driving device 100 delivers (recovers) energy to (from) the capacitive load 122 via the inductor 120 while dissipating virtually none of this energy as heat, the power efficiency of the device 100 is increased.

A method of operating the presently disclosed capacitive load driving device 100 is illustrated by reference to FIG. 2. In this illustrative example, the controller 102 (see FIG. 1) is configured to receive an input voltage $V_{in}$ 302 (see FIG. 3), a measured voltage level $V_{Cm}$, a measured current level $I_{Lm}$, and optionally the clock signal CLK. The controller 102 is further configured to make determinations based on the level of the input voltage $V_{in}$ 302, the direction of the rate of change of the input voltage $V_{in}$ 302 (i.e., whether the input voltage $V_{in}$ 302 is increasing or decreasing), the measured voltage level $V_{Cm}$, and the measured current level $I_{Lm}$. Based on the outcome of these determinations, the controller 102 controls the DC current source 101 and plurality of interconnect switches 110, 112, 114, and 116 to generate an output voltage $V_{out}$ 304 (see FIG. 3) across the capacitive load 122 corresponding to the input voltage $V_{in}$ 302.

Figure 2:
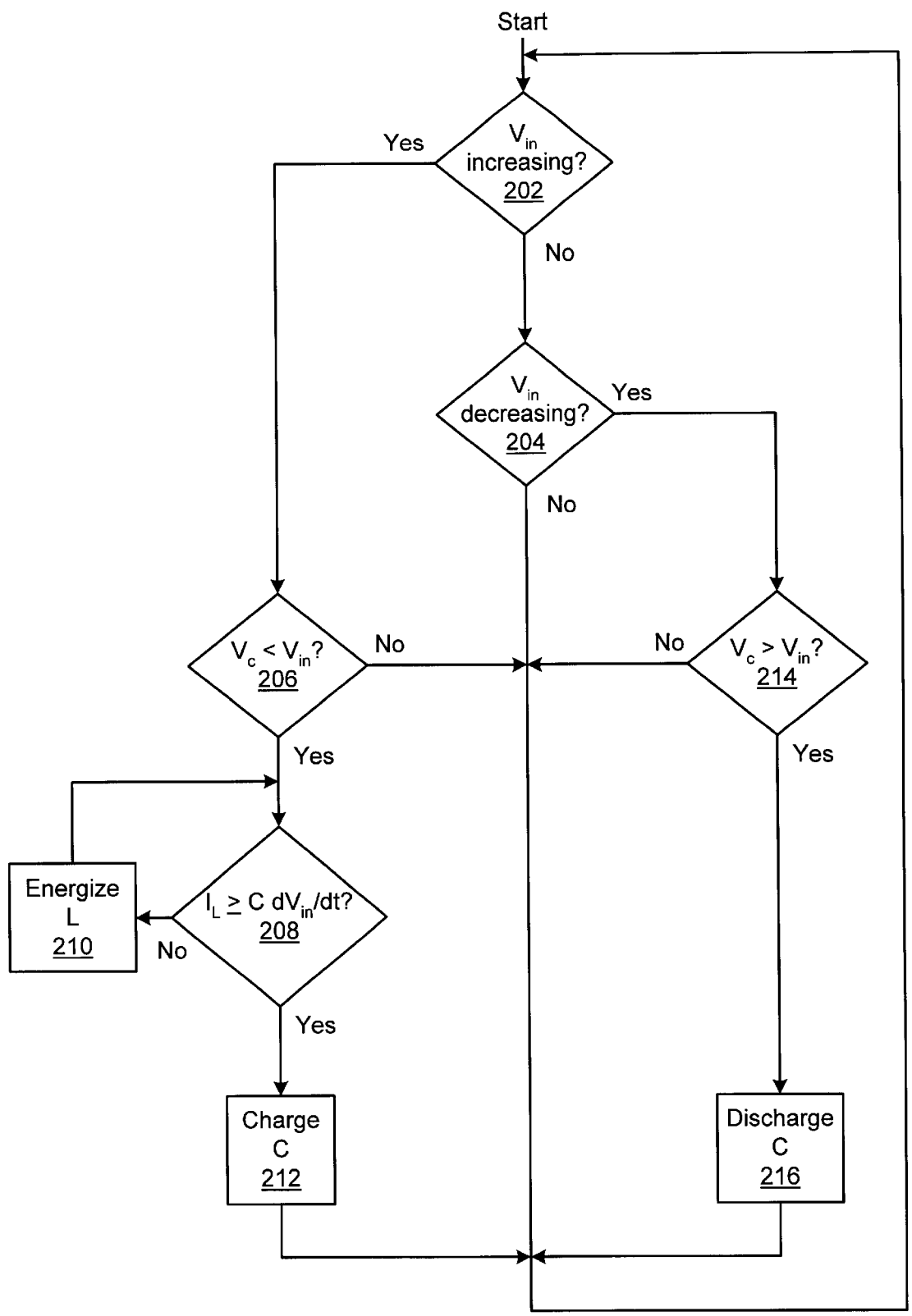
FIG. 2 is a flow diagram depicting an exemplary method of operating the capacitive load driving device of FIG. 1 according to the present invention.

It is noted that the method of FIG. 2 may be performed at fixed time intervals (i.e., the capacitive load driving device 100 may operate in a synchronous manner) or at variable time intervals (i.e., the capacitive load driving device 100 may operate in an asynchronous manner). Further, the optional clock signal CLK is normally employed when the device 100 operates synchronously, and may be omitted when the device 100 operates asynchronously.

In this illustrative example, the switches 106, 114, and 116 are initially open, and the switches 110 and 112 are initially closed (alternatively, the switches 106, 110, and 112 may be initially open, and the switches 114 and 116 may be initially closed). The plurality of interconnected switches 110, 112, 114, and 116 are not allowed to be open simultaneously. As depicted in block 202, a determination is made as to whether the input voltage $V_{in}$ 302 is increasing. For example, the controller 102 may make this determination by comparing the level of the input voltage $V_{in}$ 302 at the present time with the level of the input voltage $V_{in}$ 302 at an earlier time. It is noted that the input voltage $V_{in}$, 302 is increasing from time $t_0$ to time $t_1$, (see FIG. 3). In the event the input voltage $V_{in}$ 302 is increasing, a determination is made, as depicted in block 206, as to whether the voltage level $V_{Cm}$ is less than the level of the input voltage $V_{in}$ 302, i.e., $$V_C < V_{in}. \quad (1)$$

In the event the voltage level $V_{Cm}$ is less than the input voltage level $V_{in}$ 302, a determination is made as to whether the current level $I_{Lm}$ is sufficient for charging the capacitive load 122. Specifically, a determination is made, as depicted in block 208, as to whether $$I_L < C \, dV_{in}/dt, \quad (2)$$

in which "C" is the capacitance of the capacitive load 122. In the event the current level $I_{Lm}$ is insufficient for charging the capacitive load, the inductor 120 is energized, as depicted in block 210. Specifically, the controller 102 actuates the switch 106 to allow the voltage source 104 to feed energy into the inductor 120 until $$I_L \geq C \, dV_{in}/dt, \quad (3)$$

at which time the switch 106 is deactivated.

When current level $I_{Lm}$ is sufficient for charging the capacitive load 122, the load 122 is charged, as depicted in block 212. Specifically, the controller 102 actuates the switches 110 and 116 to allow current to flow from the inductor 120 to the capacitive load 122 (i.e., the inductor delivers energy to the load) until $$V_C \geq V_{in} \quad (4)$$

at which time the plurality of interconnected switches 110, 112, 114, and 116 revert to their initial configuration to hold the charge on the capacitive load 122.

In the event it is determined in block 202 that the input voltage $V_{in}$ 302 is not increasing, a determination is made, as depicted in block 204, as to whether the voltage level $V_{Cm}$ is decreasing. Again, the controller 102 may make this determination by comparing the level of the input voltage $V_{in}$ 302 at the present time with the level of $V_{in}$ 302 at an earlier time. It is noted that the input voltage $V_{in}$ 302 is decreasing from time $t_1$, to time $t_2$ (see FIG. 3). In the event the input voltage $V_{in}$ 302 is decreasing, a determination is made, as depicted in block 214, as to whether the voltage level $V_{Cm}$ is greater than the level of the input voltage $V_{in}$ 302, i.e., $$V_C > V_{in}. \quad (5)$$

In the event the voltage level $V_{Cm}$ is greater than the input voltage level $V_{in}$ 302, the capacitive load 122 is discharged, as depicted in block 216. Specifically, the controller 102 actuates the switches 112 and 114 to allow current to flow from the capacitive load 122 to the inductor 120 (i.e., the inductor recovers energy from the load) until $$V_C \leq V_{in} \quad (6)$$

at which time the plurality of interconnected switches 110, 112, 114, and 116 revert to their initial configuration to hold the charge on the capacitive load 122. Alternatively, the inductor 120 may charge the load 122 negatively. By repeating the above-described method at fixed or variable time intervals, the capacitive load driving device 100 (see FIG. 1) can generate an output voltage waveform $V_{out}$ across the capacitive load 122 that corresponds to essentially any arbitrary input voltage waveform $V_{in}$.

It should be understood that the method depicted in FIG. 2 is presented for purposes of illustration. In a preferred embodiment, the controller 102 employs a mathematically optimal control algorithm to control the operation of the DC current source 101 and the plurality of interconnected switches 110, 112, 114, and 116. Following such an algorithm, the controller 102 makes control decisions based not only on the state of the system at specific times but also on trends. The controller 102 then considers all of the possible control choices, and selects the one that minimizes the error between the input voltage waveform $V_{in}$ and the output voltage waveform $V_{out}$.

Figure 3:
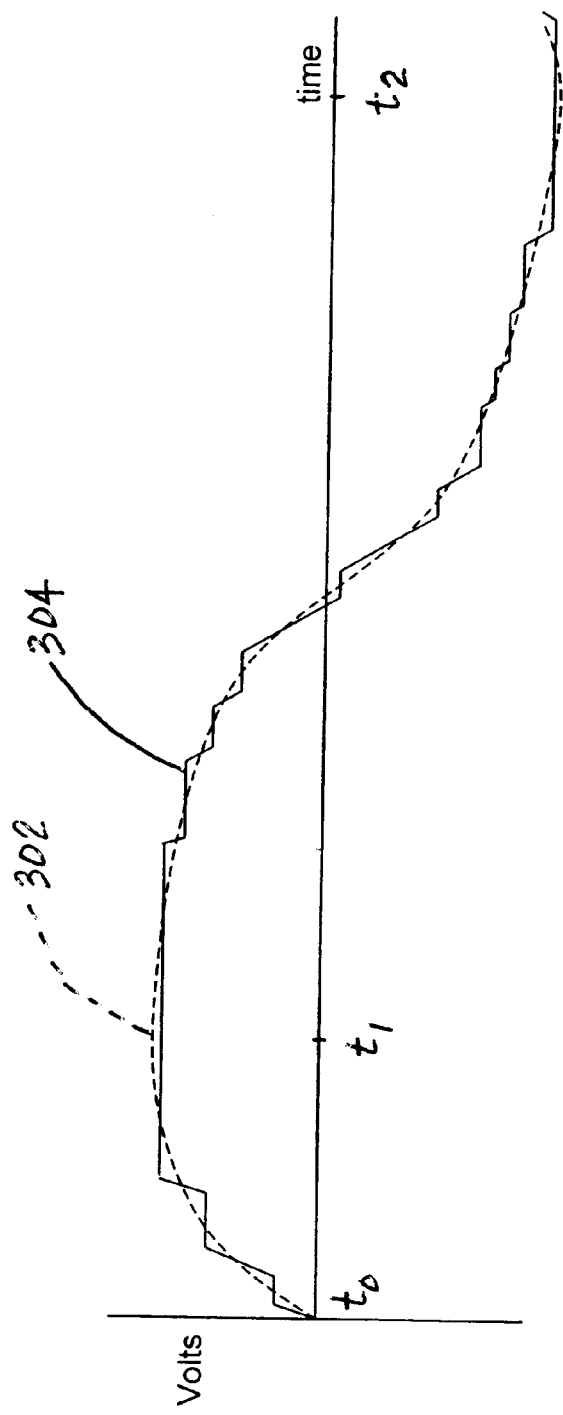
FIG. 3 is a diagram depicting an exemplary input waveform applied to the capacitive load driving device of FIG. 1 and an output voltage waveform corresponding to the input waveform generated across a capacitive load by the capacitive load driving device.

It is noted that as the capacitive load driving device 100 selectively charges and discharges (or charges negatively) the capacitive load 122, the output voltage waveform $V_{out}$ 304 either ramps up or down following the same slope. As shown in FIG. 3, the output voltage waveform $V_{out}$ 304 ramps up following the same slope during three (3) successive time intervals between time $t_o$ and time $t_1$. Further, the output voltage waveform $V_{out}$ 304 ramps down following the same slope during ten (10) successive time intervals between time $t_1$ and time $t_2$. This is because only one current source, i.e., the DC current source 101, is used to drive the capacitive load 122.

Figure 4:
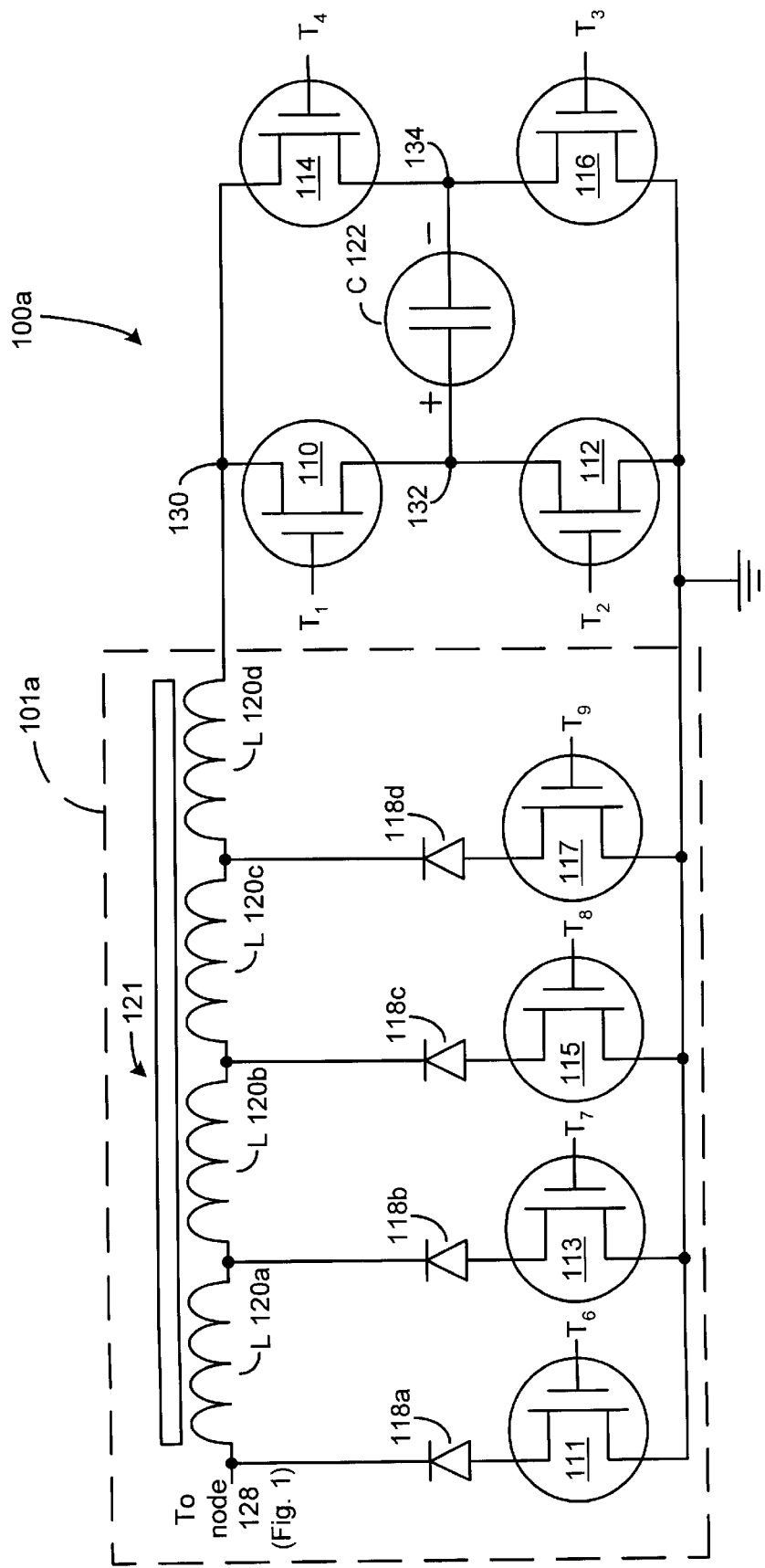
FIG. 4 is a schematic diagram depicting an alternative embodiment of the capacitive load driving device of FIG. 1 including multiple current sources.

FIG. 4 depicts an alternative embodiment 100a of the capacitive load driving device that includes a DC current source 101a configured to provide a plurality of current output levels. Specifically, the capacitive load driving device 100a includes a transformer 121 having a plurality of secondary windings 120a–120d, a plurality of diodes 118a–118d, and a plurality of switches 111, 113, 115, and 117 (e.g., power MOSFET switches), which replace the single inductor 120 and the single diode 118 included in the capacitive load driving device 100 (see FIG. 1). The to primary winding of the transformer 121 is omitted from FIG. 4 for clarity. It is noted that the inductance of the secondary windings 120a–120d may alternatively be provided by a plurality of inductors. Accordingly, the controller 102 is configured to control the operation of the switches 111, 113, 115, and 117 by generating digital control signals $T_6$, $T_7$, $T_8$, and $T_9$. The controller 102 controls the switches 111, 113, 115, and 117 either individually or in combination to provide selected current output levels at the current source output 130, thereby causing the output voltage waveform $V_{out}$ to ramp up or down following different slopes. In this way, the output voltage waveform $V_{out}$ can be made to correspond more closely to the input voltage waveform $V_{in}$ with a slower switching frequency.

It will further be appreciated by those of ordinary skill in the art that modifications to and variations of the above-described power efficient capacitive load driving device may be made without departing from the inventive concepts disclosed herein. Accordingly, the invention should not be viewed as limited except as by the scope and spirit of the appended claims.

What is claimed is:

1. A device for driving a capacitive load, comprising:
   at least one current source having an output;
   a plurality of switches coupleable to the load and configured to be controlled for switchingly connecting the load between the current source output and a reference potential to place the load in at least a first orientation to charge the load positively and a second orientation to discharge the load or charge the load negatively; and
   a controller configured to receive a first input representing a predetermined waveform, and control the switches based on at least the first input to place the load in at least the first or second orientation to cause a voltage differential across the load to correspond to the predetermined waveform.

2. The device of claim 1 wherein the controller is further configured to receive a second input corresponding to the voltage differential across the load, and control the switches based on at least the first and second inputs to place the load in at least the first or second orientation to cause the voltage differential across the load to correspond to the predetermined waveform.

3. The device of claim 1 wherein the plurality of switches is further configured to be controlled for switchingly connecting the load between the current source output and the reference potential to place the load in a third orientation to hold charge on the load, and the controller is further configured to control the switches based on at least the first input to place the load in at least the first, second, or third orientation to cause the voltage differential across the load to correspond to the predetermined waveform.

4. The device of claim 1 wherein the current source comprises one or more DC current sources.

5. The device of claim 1 wherein the current source comprises one or more AC or time-varying current sources.

6. The device of claim 1 wherein the current source includes an inductor connected in series with the current source output.

7. The device of claim 6 wherein the inductor comprises a winding of a transformer.

8. The device of claim 1 wherein the at least one current source comprises a plurality of current sources configured to be controlled for providing a selected current level at the current source output.

9. The device of claim 8 wherein the controller is further configured to control the plurality of current sources for providing the selected current level at the current source output based on at least the first input.

10. The device of claim 1 wherein the plurality of switches is coupleable between the current source output and the load in an H-bridge configuration.

11. The device of claim 1 wherein the controller is configured to control the switches at fixed time intervals.

12. The device of claim 1 wherein the controller is configured to control the switches at variable time intervals.

13. The device of claim 1 wherein the capacitive load comprises at least one capacitive transducer.

14. The device of claim 13 wherein the first input voltage waveform comprises an ultrasonic signal.

15. A method of driving a capacitive load, comprising the steps of:
    providing at least one current source having an output and a plurality of switches for switchingly connecting the load between the current source output and a reference potential to place the load in at least a first orientation to charge the load positively and a second orientation to discharge the load or charge the load negatively;
    receiving a first input representing a predetermined waveform by a controller; and
    controlling the switches based on at least the first input to place the load in at least the first or second orientation by the controller to cause a voltage differential across the load to correspond to the predetermined waveform.

16. The method of claim 15 wherein the receiving step further includes receiving a second input corresponding to the voltage differential across the load by a controller, and the controlling step further includes controlling the switches based on at least the first and second inputs to place the load in at least the first or second orientation by the controller to cause the voltage differential across the load to correspond to the predetermined waveform.

17. The method of claim 15 wherein the providing step further includes providing the plurality of switches for switchingly connecting the load between the current source output and the reference potential to place the load in a third orientation to hold charge on the load, and the controlling step further includes controlling the switches based on at least the first input to place the load in at least the first, second, or third orientation by the controller to cause the voltage differential across the load to correspond to the predetermined waveform.

18. The method of claim 15 wherein the providing step includes providing a plurality of current sources, and the controlling step includes controlling the plurality of current sources to provide a selected current level at the current source output based on at least the first input by the controller.

19. The method of claim 15 wherein the controlling step is performed at fixed time intervals by the controller.

20. The method of claim 15 wherein the controlling step is performed at variable time intervals by the controller.

21. The method of claim 15 wherein the controlling step is performed by the controller using a mathematically optimal control algorithm to minimize an error signal between the voltage differential across the load and the predetermined waveform.

* * * * *